United States Patent
Leung et al.

(10) Patent No.: US 9,583,527 B1
(45) Date of Patent: Feb. 28, 2017

(54) CONTACT RESISTANCE REDUCTION

(71) Applicant: OMNIVISION TECHNOLOGIES, INC., Santa Clara, CA (US)

(72) Inventors: Kevin Ka Kei Leung, San Jose, CA (US); Hsin-Neng Tai, San Jose, CA (US); Hung-Ming Weng, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 15/009,526

(22) Filed: Jan. 28, 2016

(51) Int. Cl.
*H01L 27/146* (2006.01)

(52) U.S. Cl.
CPC .............................. *H01L 27/14636* (2013.01)

(58) Field of Classification Search
None
See application file for complete search history.

(56) References Cited

U.S. PATENT DOCUMENTS

| | | | |
|---|---|---|---|
| 8,247,262 B2 | 8/2012 | Huang et al. | |
| 2014/0001561 A1 | 1/2014 | Cheng et al. | |
| 2014/0027827 A1 | 1/2014 | Manabe et al. | |
| 2014/0239152 A1 | 8/2014 | Chen et al. | |
| 2016/0093651 A1* | 3/2016 | Sato | H04N 5/3745 257/229 |

OTHER PUBLICATIONS

Ban et al., "Modeling and Characterization of Contact-Edge Roughness for Minimizing Design and Manufacturing Variations in 32-nm Node Standard Cell", J. Micro/Nanolith, MEMS MOEMS, 9(4), 041211 (Dec. 3, 2010), 11 pages.

* cited by examiner

*Primary Examiner* — Angel Roman
*Assistant Examiner* — Kevin Quinto
(74) *Attorney, Agent, or Firm* — Blakely Sokoloff Taylor & Zafman LLP

(57) ABSTRACT

An image sensor includes a plurality of photodiodes disposed in a semiconductor material and a floating diffusion disposed in the semiconductor material adjacent to a photodiode in the plurality of photodiodes. A transfer gate is disposed to transfer image charge generated in the photodiode into the floating diffusion. A first electrical contact with a first cross sectional area is coupled to the transfer gate. A second electrical contact with a second cross sectional area is coupled to the floating diffusion, and the second cross sectional area is greater than the first cross sectional area. The image sensor also includes pixel transistor region disposed in the semiconductor material including a first electrical connection to the semiconductor material. A third electrical contact with a third cross sectional area is coupled to the first electrical connection to the semiconductor material, and the third cross sectional area is greater than the first cross sectional area.

20 Claims, 4 Drawing Sheets

CONTACT RESISTANCE REDUCTION

TECHNICAL FIELD

This disclosure relates generally to image sensors, and in particular but not exclusively, relates to contact resistance reduction.

BACKGROUND INFORMATION

Image sensors have become ubiquitous. They are widely used in digital still cameras, cellular phones, security cameras, as well as, medical, automobile, and other applications. The technology used to manufacture image sensors has continued to advance at a great pace. For example, the demands of higher resolution and lower power consumption have encouraged the further miniaturization and integration of these devices.

Semiconductor device performance (including image sensor device performance) is directly related to the types of metal-semiconductor junctions employed within the device. Depending on the different pieces of circuitry being electrically contacted, many different material compatibility related issues may arise. For instance, one piece of device architecture may require a relatively high charge carrier density to move through it during device operation. In this situation, it may be advantageous to tailor the choice of material or device dimensions to best match the specific performance requirement.

Contact resistance refers to the resistance attributed to the interfaces between touching electrical leads (as opposed to the intrinsic resistance of any one part in the system, which is an inherent property). Similar to tailoring specific pieces of device architecture to meet specific performance specs, electrical contacts may have to be tailored to have specific properties. In some situations failure to optimize electrical contacts may lead to diminished device performance and possibly critical failure.

BRIEF DESCRIPTION OF THE DRAWINGS

Non-limiting and non-exhaustive examples of the invention are described with reference to the following figures, wherein like reference numerals refer to like parts throughout the various views unless otherwise specified.

Figure 1A:
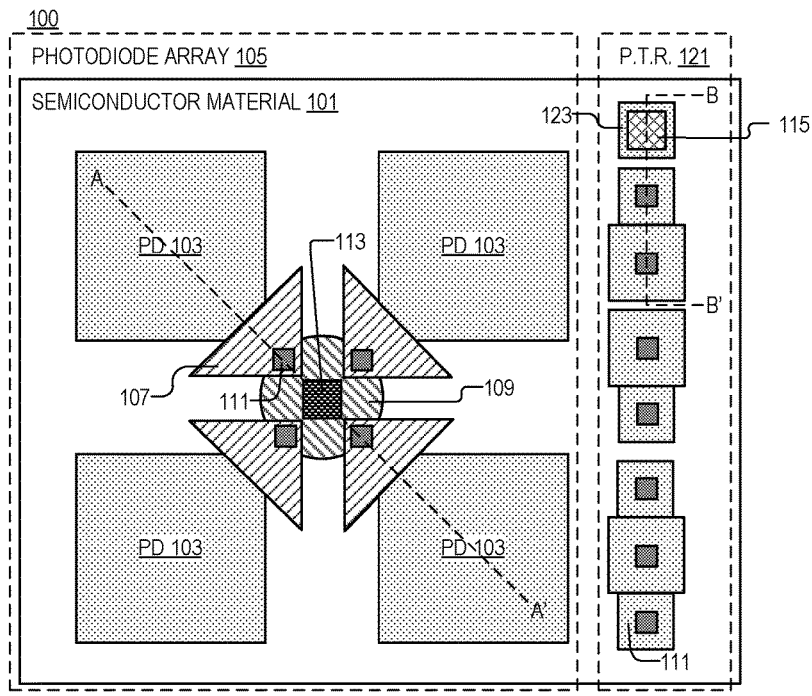
FIG. 1A is an illustration of a top down view of an example image sensor, in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exagerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples of an apparatus and method for image sensor contact resistance reduction are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

FIG. 1A is an illustration of a top down view of example image sensor 100. It is worth noting that the depicted top down view of image sensor 100 is omitting interlayer dielectric 141, and gate oxide 151 in order to avoid obscuring the underlying device architecture (see infra FIG. 1B). In the depicted example, image sensor 100 includes: semiconductor material 101, plurality of photodiodes 103 (arranged into photodiode array 105), transfer gate 107, floating diffusion 109, and pixel transistor region 121. Image sensor 100 also includes first electrical contacts 111 coupled to transfer gates 107, second electrical contact 113 coupled to floating diffusion 109, and third electrical contact 115 coupled to first electrical connection 123 in pixel transistor region 121. Pixel transistor region 121 also includes several other first electrical contacts 111 coupled to other pieces of device architecture in pixel transistor region 121. In one example, other pieces of device architecture in pixel transistor region 121 may include (from top of page to bottom of page in FIG. 1A): a bitline, a reset transistor, a source follower gate, source follower drain, a to-floating-diffusion transistor, a reset transistor gate, and a reset transistor drain.

In one example, first electrical connection 123 in pixel transistor region 121 is a P+ contact to semiconductor material 101. To clarify, when a semiconductor layer such as semiconductor material 101 is made very thin, and/or when the number of pixels is made large, resistance in the semiconductor layer may become large and reduce device performance. This problem may be mitigated with ground contact structures (such as first electrical connection 123) coupled to grounding metal layer traces. In the depicted example, first electrical connection 123 is surrounded by shallow trench isolation structures 114.

As shown, plurality of photodiodes 103 is arranged into an array 105 including four photodiodes 103. Four transfer gates 107 are disposed in the center of plurality of photodiodes 103 and are positioned to transfer image charge from plurality of photodiodes 103 into floating diffusion 109. Floating diffusion 109 is located in the center of the four photodiodes 103 and is circular. In one example, transfer gate 107 includes polysilicon and may be doped. Although the depicted example shows four photodiodes 103, in one or more examples, plurality of photodiodes 103 can include any number of photodiodes 103 coupled to floating diffusion 109 including two, six, and eight photodiodes 103. Additionally, the orientation of the photodiode array 105 may not be square and may take any other configuration such as circular, or the like. Furthermore, although in the depicted example pixel transistor region 121 is disposed on the right edge of semiconductor material 101, pixel transistor region 121 may be disposed in any location around the photodiode array 105 and may surround photodiode array 105.

Figure 1B:
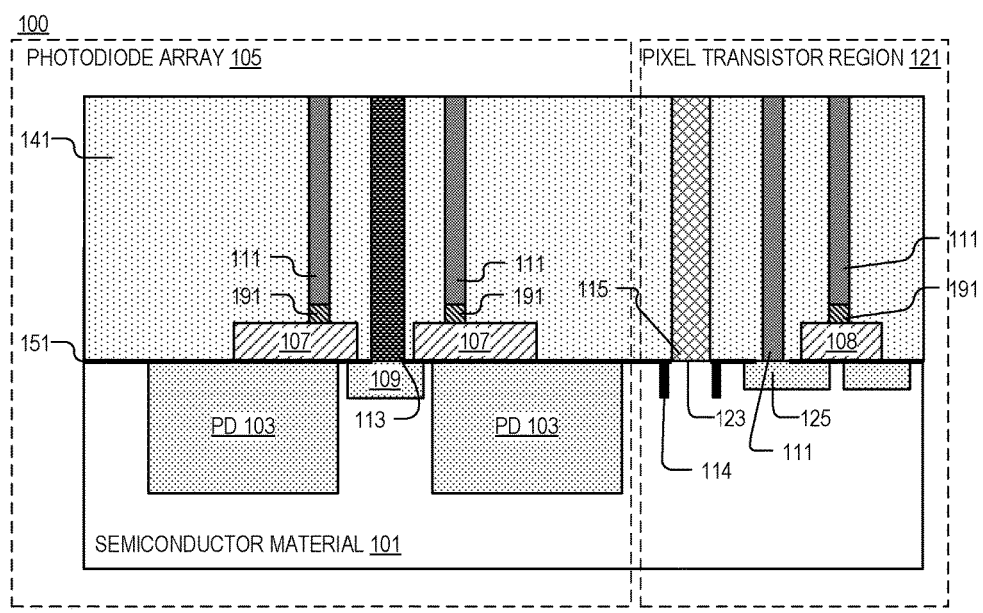
FIG. 1B is a cross sectional illustration of the example image sensor of FIG. 1A, in accordance with the teachings of the present invention.

FIG. 1B is a cross sectional illustration of the example image sensor 100 of FIG. 1A. It should be noted that FIG. 1B is not a true cross section but rather a hybrid of two views. Photodiode array 105 is viewed along line A-A' while pixel transistor region 121 is viewed along line B-B'. Plurality of photodiodes 103 is disposed in semiconductor material 101. Floating diffusion 109 is disposed in semiconductor material 101 adjacent to a photodiode 103 in the plurality of photodiodes 103. Transfer gate 107 is disposed to transfer image charge generated in photodiode 103 into floating diffusion 109. First electrical contact 111, with a first cross sectional area, is coupled to transfer gate 107. Second electrical contact 113, with a second cross sectional area, is coupled to floating diffusion 109, and the second cross sectional area is greater than the first cross sectional area of first electrical contact 111. Pixel transistor region 121 is disposed in semiconductor material 101 and includes first electrical connection 123 to semiconductor material 101. Third electrical contact 115, with a third cross sectional area, is coupled to first electrical connection 123 to semiconductor material 101, and the third cross sectional area is greater than the first cross sectional area of first electrical contact 111.

In the depicted example, interlayer dielectric 141 is disposed on semiconductor material 101, and transfer gate 107 is disposed between semiconductor material 101 and interlayer dielectric 141. Furthermore, gate oxide 151 is disposed between interlayer dielectric 141 and semiconductor material 101. First electrical contact 111 extends through interlayer dielectric 141 to transfer gate 107, and second electrical contact 113 extends through interlayer dielectric 141 to floating diffusion 109. Third electrical contact 115 extends through interlayer dielectric 141 to first electrical connection 123.

As illustrated, in one example, a plurality of electrical contacts in pixel transistor region 121 are coupled to pixel transistor region 121, and the plurality of electrical contacts have a cross sectional area substantially equal to the first cross sectional area of first electrical contact 111. In one example, first electrical contact 111, second electrical contact 113, third electrical contact 115, and the plurality of electrical contacts include tungsten.

In one example, the third cross sectional area of third electrical contact 115 is greater than the second cross sectional area of second electrical contact 113. However, in another example, the second cross sectional area of second electrical contact 113 is greater than the third cross sectional area of third electrical contact 115. In both examples, the second cross sectional area and the third cross sectional area are greater than a threshold cross sectional area. The threshold cross sectional area is a size of cross sectional area, below which, pixels in the center of a pixel array have a substantially higher noise signal than pixels on edges of the array. In the illustrated example, silicide layers 191 are disposed between first electrical contact 111 and transfer gate 107, and silicide layers 191 reduce contact resistance between first electrical contact 111 and transfer gate 107. However, in other examples, silicide layers 191 may be placed between second electrical contact 113 and floating diffusion 109, and between third electrical contact 115 and first electrical connection 123. In one example, silicide layers 191, may include a material composition such as $Co_xSi_y$, or $Ni_xSi_y$. However, in a different example, silicide layers 191 may have different material composition among one another, and may include other metals (such as Co, Ni, Ta, Ti, Zn, In, Pb, Ag, etc.) and semiconductor elements.

In the depicted example, it is worth noting that the first cross sectional area of first electrical contacts 111 is less than half the size of the lateral surface area of the transfer gates 107 that first electrical contacts 111 are in contact with. In another example, the first cross sectional area of first electrical contacts 111 is less than a quarter the size of the lateral surface area of the transfer gates 107 that first electrical contacts 111 are in contact with. In one example, the first cross sectional area of first electrical contacts 111 is less than half the size of the second cross sectional area of second electrical contact 113 and/or less than half the size of the third cross sectional area of third electrical contact 115. In another example, the first cross sectional area of first electrical contacts 111 is less than 75% the size of the second cross sectional area of second electrical contact 113 and/or less than 75% the size of the third cross sectional area of third electrical contact 115. In one example, first electrical contact 111, second electrical contact 113, and third electrical contact 115, only contact the surface of underlying device architecture; however, in another example, first electrical contact 111, second electrical contact 113, and third electrical contact 115, may extend a distance into the underlying device architecture. Although not depicted in FIG. 1B, in one example an etch stop layer may be disposed above gate oxide 151 and on select pieces of device architecture (e.g., on the upper surfaces of transfer gates 107).

Although not depicted, in one example, a color filter layer may be optically aligned with plurality of photodiodes 103. The color filter layer may include red, green, and blue color filters which may be arranged into a Bayer pattern, EXR pattern, X-trans pattern, or the like. However, in a different or the same example, the color filter layer may include infrared filters, ultraviolet filters, or other light filters that isolate invisible portions of the EM spectrum. In the same or a different example, a microlens layer is formed on the color filter layer. The microlens layer may be fabricated from a photo-active polymer that is patterned on the surface of the color filter layer. Once rectangular blocks of polymer are patterned on the surface of the color filter layer, the blocks may be melted (or reflowed) to form the dome-like structure characteristic of microlenses.

In one or more examples, other pieces of device architecture may be present in/on image sensor 100 such as pinning wells between photodiodes 103, and electrical isolation structures. In one example, the internal components of image sensor 100 may be surrounded by electrical and/or optical isolation structures. This may help to reduce noise in image sensor 100. Electrical isolation may be accomplished by etching isolation trenches in semiconductor material 101 around individual photodiodes 103 which may then be filled with semiconductor material, oxide material, or the like. Optical isolation structures may be formed by constructing a reflective grid on the surface of semiconductor material 101 disposed beneath a color filter layer. The optical isolation structures may be optically aligned with the plurality of photodiodes 103.

In operation, photodiodes 103 in image sensor 100 collect image light and generate image charge by virtue of the P-N junction contained within them. Image charge is sent to floating diffusion 109 by applying a voltage (greater than a threshold voltage) to transfer gate 107. Charge may then be read out of floating diffusion 109 to form image data. In some examples, the voltage/current requirements necessary to perform these operations may differ between different pieces of image sensor 100 device architecture. Furthermore, contact resistance may vary between the various layers of device architecture and the electrical contacts (e.g., the junctions of first electrical contact 111, second electrical contact 113, and third electrical contact 115 and their corresponding pieces of semiconductor circuitry may all have different contact resistances). In some examples, the magnitude of dark signals in the device is proportional to the contact resistance at various semiconductor-metal junctions. By reducing the contact resistance at these junctions, the magnitude of the dark signals may be reduced. One way to reduce contact resistance is by increasing the contact interface area. Accordingly, the instant disclosure provides a way to reduce contact resistance by varying the cross sectional area of electrical contacts. One skilled in the relevant art will appreciate that this device architecture can easily be incorporated into existing semiconductor fabrication lines.

Figure 2:
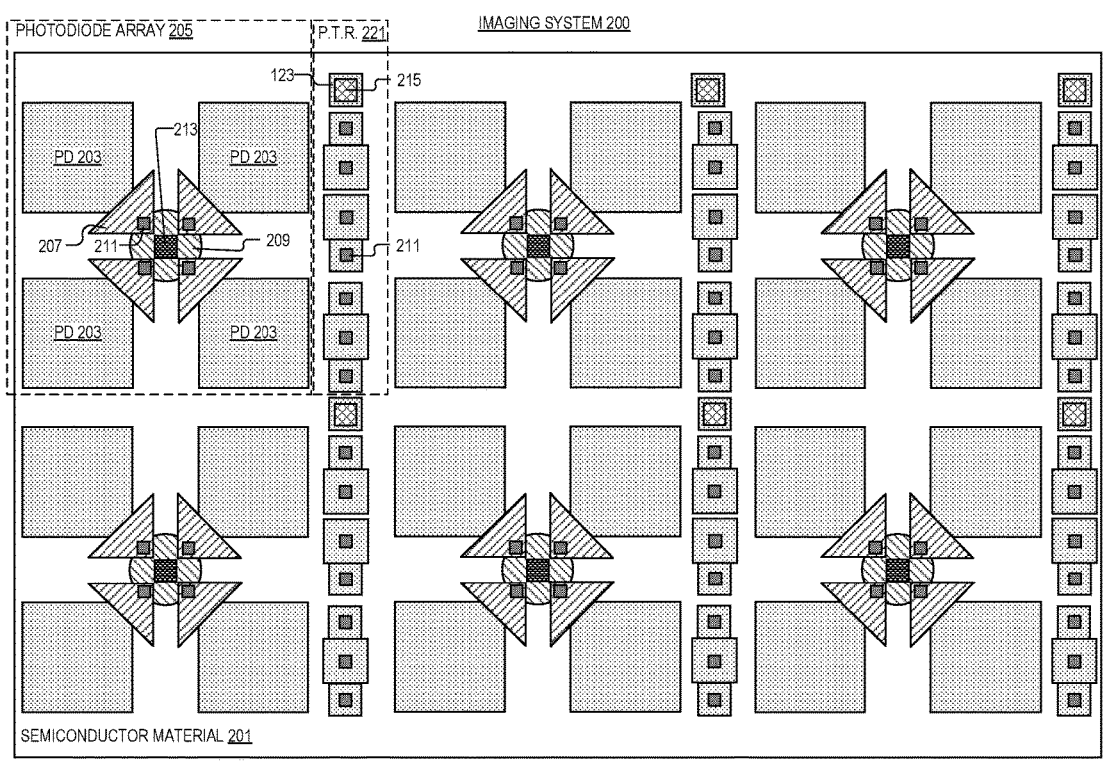
FIG. 2 illustrates one example of an imaging system including a plurality of image sensors from FIGS. 1A and 1B, in accordance with the teachings of the present invention.

FIG. 2 illustrates one example of an imaging system 200 including a plurality of image sensors from FIGS. 1A and 1B. In the depicted example, plurality of photodiodes 103 has been arranged into an array including rows and columns. Here, a relatively simple device is depicted with only six columns and four rows of photodiodes 103. However, in another example, any number of photodiode rows and columns may be used to implement the teachings in accordance with the present invention. Although not depicted, a metal line layer may extend across the surface of the photodiode array 205; connecting elements of pixel transistor region 221 and photodiode array 205 to one another and other logic (not depicted).

Figure 3:
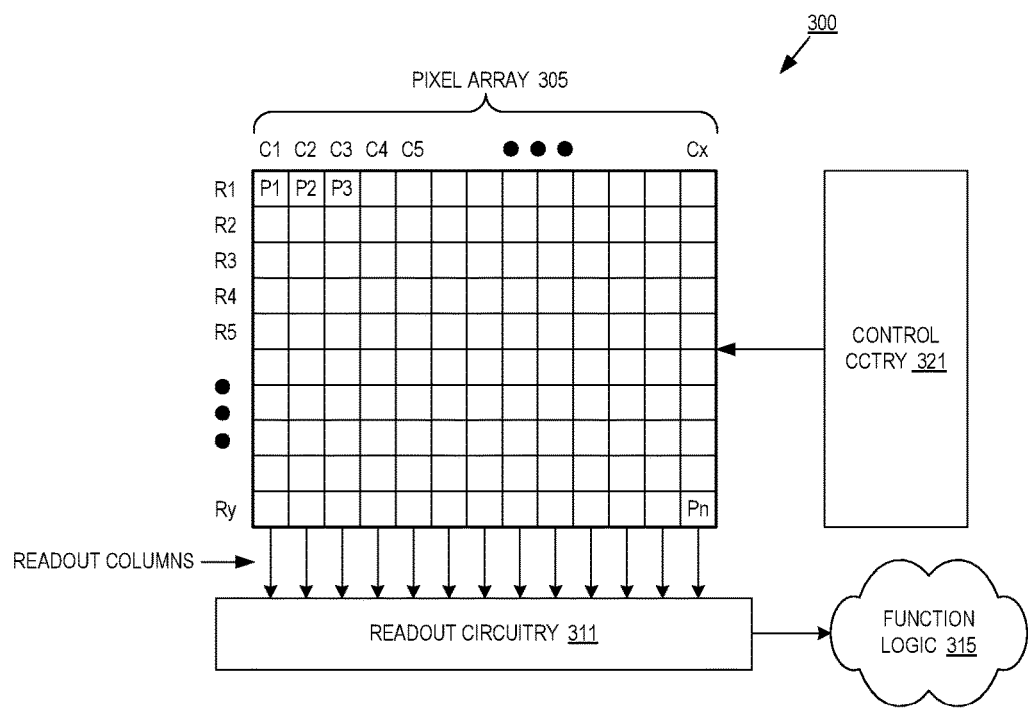
FIG. 3 is a block diagram illustrating one example of an imaging system including the imaging system of FIG. 2, in accordance with the teachings of the present invention.

FIG. 3 is a block diagram illustrating one example of an imaging system 300 including the imaging system of FIG. 2. Imaging system 300 includes pixel array 305, control circuitry 321, readout circuitry 311, and function logic 315. In one example, pixel array 305 is a two-dimensional (2D) array of photodiodes, or image sensor pixels (e.g., pixels P1, P2 . . . , Pn). As illustrated, photodiodes are arranged into rows (e.g., rows R1 to Ry) and columns (e.g., column C1 to Cx) to acquire image data of a person, place, object, etc., which can then be used to render a 2D image of the person, place, object, etc. However, the rows and columns do not necessarily have to be linear and may take other shapes depending on use case.

In one example, after each image sensor photodiode/pixel in pixel array 305 has acquired its image data or image charge, the image data is readout by readout circuitry 311 and then transferred to function logic 315. Readout circuitry 311 may be coupled to readout image data from the plurality of photodiodes in pixel array 305, and may be included in the pixel transistor region (e.g., pixel transistor region 121).

In various examples, readout circuitry 311 may include amplification circuitry, analog-to-digital (ADC) conversion circuitry, or otherwise. Function logic 315 may simply store the image data or even alter/manipulate the image data by applying post image effects (e.g., crop, rotate, remove red eye, adjust brightness, adjust contrast, or otherwise). In one example, readout circuitry 311 may readout a row of image data at a time along readout column lines (illustrated) or may readout the image data using a variety of other techniques (not illustrated), such as a serial readout or a full parallel readout of all pixels simultaneously.

In one example, control circuitry 321 is coupled to pixel array 305 to control operation of the plurality of photodiodes in pixel array 305, and may be included in the pixel transistor region (e.g., pixel transistor region 121). For example, control circuitry 321 may generate a shutter signal for controlling image acquisition. In one example, the shutter signal is a global shutter signal for simultaneously enabling all pixels within pixel array 305 to simultaneously capture their respective image data during a single acquisition window. In another example, the shutter signal is a rolling shutter signal such that each row, column, or group of pixels is sequentially enabled during consecutive acquisition windows. In another example, image acquisition is synchronized with lighting effects such as a flash.

In one example, imaging system 300 may be included in a digital camera, cell phone, laptop computer, or the like. Additionally, imaging system 300 may be coupled to other pieces of hardware such as a processor, memory elements, output (USB port, wireless transmitter, HDMI port, etc.), lighting/flash, electrical input (keyboard, touch display, track pad, mouse, microphone, etc.), and/or display. Other pieces of hardware/software may deliver instructions to imaging system 300, extract image data from imaging system 300, or manipulate image data supplied by imaging system 300.

Figure 4:
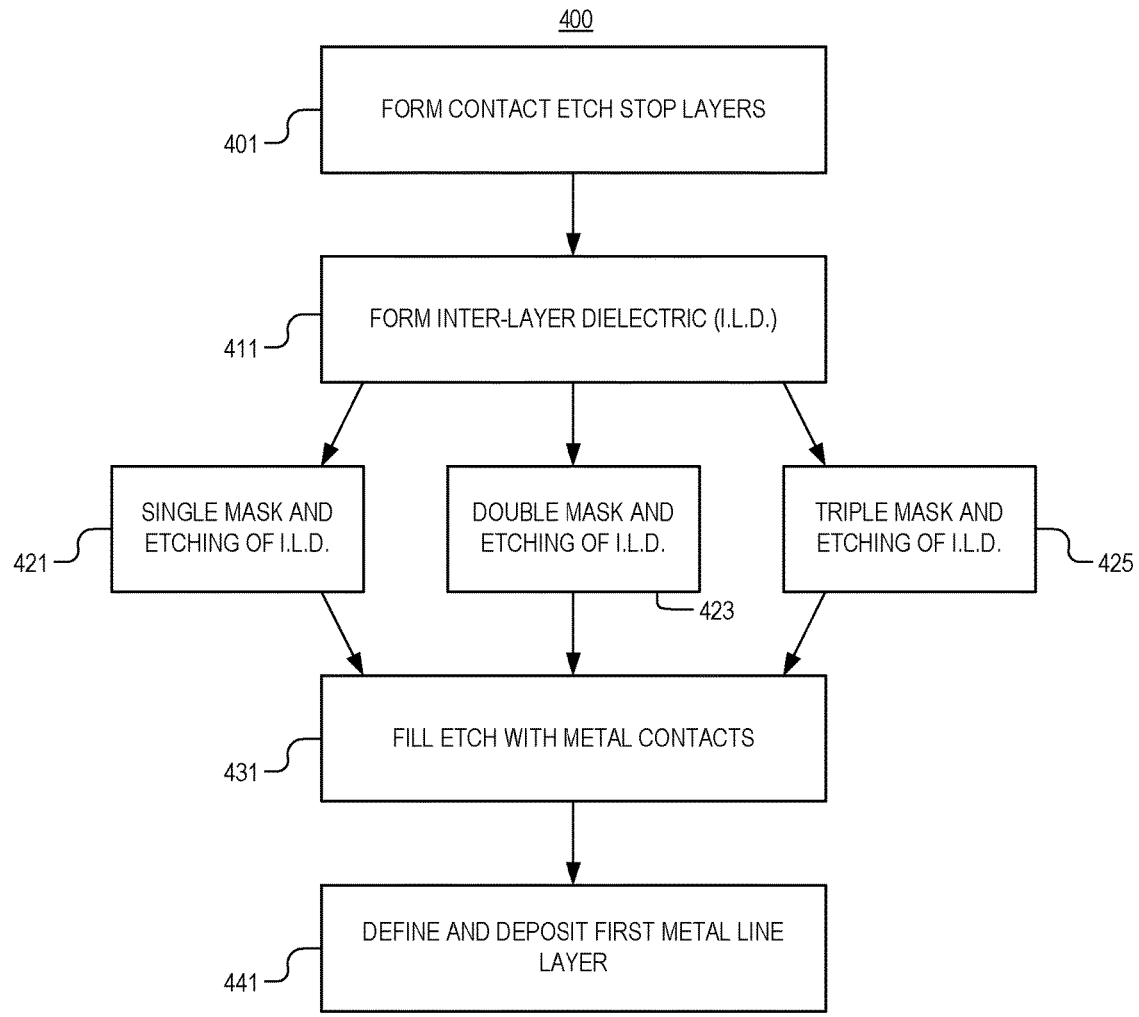
FIG. 4 depicts an example method for forming the image sensor of FIGS. 1A and 1B, in accordance with the teachings of the present invention.

FIG. 4 depicts an example method 400 for forming the image sensor of FIGS. 1A and 1B. The order in which some or all of blocks appear in method 400 should not be deemed limiting. Rather, one of ordinary skill in the art having the benefit of the present disclosure will understand that some of method 400 may be executed in a variety of orders not illustrated, or even in parallel. Furthermore, method 400 may omit certain blocks in order to avoid obscuring certain aspects. Alternatively, method 400 may include additional blocks that may not be necessary in some embodiments/examples of the disclosure.

It is worth noting that the example method 400 depicted in FIG. 4 starts mid-way through the image sensor fabrication process. At the beginning of example method 400, a plurality of photodiodes have been formed in the semiconductor material. A floating diffusion has been formed in the semiconductor material proximate to several photodiodes. A gate oxide has also been formed on top of the semiconductor material. The gate oxide may include silicon oxide or the like. Furthermore, transfer gates were fabricated on the gate oxide.

Process block 401 illustrates forming one or more contact etch stop layers on the surface of the device. In some examples, this may involve covering the entire surface of the semiconductor material/the gate oxide, and the surface of the transfer gates, and the floating diffusion. However, in another example, select pieces of device architecture may be covered while others are not. For example, the surface of transfer gates may be left exposed while the surface of the gate oxide may be covered, or vice versa. In one example, the etch stop layer may include silicon nitride.

Block 411 shows forming the interlayer dielectric on the surface of the semiconductor material. This may be accomplished by depositing an oxide material (such as silicon oxide or the like) on the surface of the semiconductor material.

Process blocks 421, 423, and 425 illustrate several mask/etch options to achieve electrical contacts of different sizes. In process block 421 only one mask step is used to create holes in the interlayer dielectric for the electrical contacts. In some examples, this may be advisable because reducing the number of process steps results in a more cost efficient fabrication line. Process block 423 shows using a two mask process for etching holes in the interlayer dielectric for electrical contacts. For example, holes for first electrical contacts could be patterned and etched, and then subsequently, larger holes for the second and third contacts could be patterned and etched. It should be noted that the patterning may be achieved with any suitable photoresist (positive or negative) and etching of holes may be achieved with any suitable etch process (wet or dry). Process block 425 depicts using three independent mask and etch steps to pattern holes for the first electrical contact, second electrical contact, and third electrical contact. This method may be preferred in situations where accuracy of etching is valued more than a reduction in process steps.

Process block 431 discloses filling the holes etched in the interlayer dielectric with metal contacts. In one example, first electrical contact, second electrical contact, and third electrical contact, all include the same material such as tungsten. However, in another example, each electrical contact may be made out of a different material. For example, first electrical contact may include tungsten and second and third electrical contact may include copper (or any other suitable metal).

Process block 441 discloses defining the first metal line layer. This involves connecting the various electrical contacts made in blocks 401-431. Metal line layers may run horizontally across the surface of the device and connect the pixel transistor region and circuitry included in the photodiode array, to other logic such as control circuitry and readout circuitry.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. An image sensor, comprising:
   a plurality of photodiodes disposed in a semiconductor material;
   a floating diffusion disposed in the semiconductor material proximate to a photodiode in the plurality of photodiodes;
   a transfer gate disposed to transfer image charge generated in the photodiode into the floating diffusion;
   a first electrical contact with a first cross sectional area, wherein the first electrical contact is coupled to the transfer gate;
   a second electrical contact with a second cross sectional area, wherein the second electrical contact is coupled to the floating diffusion, and wherein the second cross sectional area is greater than the first cross sectional area;
   a pixel transistor region disposed in the semiconductor material including a first electrical connection to the semiconductor material; and
   a third electrical contact with a third cross sectional area, wherein the third electrical contact is coupled to the first electrical connection to the semiconductor material, and wherein the third cross sectional area is greater than the first cross sectional area.

2. The image sensor of claim 1, wherein the third cross sectional area is greater than the second cross sectional area.

3. The image sensor of claim 1, wherein the second cross sectional area is greater than the third cross sectional area.

4. The image sensor of claim 1, further comprising an interlayer dielectric disposed on the semiconductor material, wherein the transfer gate is disposed between the semiconductor material and the interlayer dielectric, and wherein the first electrical contact extends through the interlayer dielectric to the transfer gate, the second electrical contact extends through the interlayer dielectric to the floating diffusion, and the third electrical contact extends through the interlayer dielectric to the first electrical connection to the semiconductor material.

5. The image sensor of claim 1, further comprising a plurality of electrical contacts in the pixel transistor region, wherein the plurality of electrical contacts are coupled to pixel transistor region, and wherein the plurality of electrical contacts have a cross sectional area substantially equal to the first cross sectional area.

6. The image sensor of claim 5, wherein the first electrical contact, the second electrical contact, the third electrical contact, and the plurality of electrical contacts include tungsten.

7. The image sensor of claim 1, further comprising a silicide layer disposed between the first electrical contact and the transfer gate, and wherein the silicide layer reduces contact resistance between the first electrical contact and the transfer gate.

8. The image sensor of claim 1, wherein the plurality of photodiodes are arranged into an array including rows and columns.

9. The image sensor of claim 8, further comprising control circuitry and readout circuitry, wherein the readout circuitry reads out image data from the plurality of photodiodes, and wherein at least some of the readout circuitry is included in the pixel transistor region, and wherein the control circuitry controls image capture with the plurality of photodiodes.

10. The image sensor of claim 8, wherein the second cross sectional area and the third cross sectional area are greater than a threshold cross sectional area, and wherein below the threshold cross sectional area, pixels in a center of the array have a substantially higher noise signal than pixels on edges of the array.

11. The image sensor of claim 1, wherein the first electrical connection in the pixel transistor region is a P+ contact to the semiconductor material.

12. An imaging system, comprising:
   a plurality of photodiodes disposed in a semiconductor material;

a floating diffusion disposed in the semiconductor material proximate to the plurality of photodiodes;

a plurality of transfer gates disposed between the plurality of photodiodes and the floating diffusion, wherein the plurality of transfer gates are positioned to transfer image charge from the plurality of photodiodes into the floating diffusion;

a plurality of first electrical contacts coupled to the plurality of transfer gates, a second electrical contact coupled to the floating diffusion, wherein a second cross sectional area of the second electrical contact is greater than a first cross sectional area of an individual first electrical contact in the plurality of first electrical contacts.

13. The imaging system of claim 12, further comprising pixel transistor region including a P+ contact to the semiconductor material, wherein a third electrical contact is coupled to the P+ contact, and wherein a third cross sectional area of the third electrical contact is greater than the first cross sectional area of the individual first electrical contact.

14. The imaging system of claim 13, wherein the third cross sectional area of the third electrical contact is greater than the second cross sectional area of the second electrical contact.

15. The imaging system of claim 13, further comprising additional first electrical contacts, wherein the pixel transistor region includes the additional first electrical contacts.

16. The imaging system of claim 14, wherein the plurality of first electrical contacts, the second electrical contact, and the third electrical contact include tungsten.

17. The imaging system of claim 12, further comprising a silicide layer disposed between the plurality of first electrical contacts and the plurality of transfer gates.

18. A system of electrical connections, comprising:
a floating diffusion disposed in a semiconductor material;
a transfer gate disposed on the semiconductor material, wherein the transfer gate is disposed proximate to the floating diffusion to transfer charge into the floating diffusion;
a pixel transistor region disposed in the semiconductor material, wherein the pixel transistor region includes a first electrical connection to the semiconductor material;
a first electrical contact coupled to the transfer gate, wherein the first electrical contact has a first cross sectional area;
a second electrical contact coupled to the floating diffusion, wherein a second cross sectional area of the second electrical contact is greater than the first cross sectional area of the first electrical contact;
a third electrical contact coupled to the first electrical connection in the pixel transistor region, wherein the third electrical contact has a third cross sectional area, and wherein the third cross sectional area is greater than the first cross sectional area of the first electrical contact.

19. The system of electrical connections of claim 18, wherein the third cross sectional area of the third electrical contact is greater than the second cross sectional area of the second electrical contact.

20. The system of electrical connections of claim 18, further comprising an interlayer dielectric disposed on the semiconductor material wherein the transfer gate is disposed between the semiconductor material and the interlayer dielectric, and wherein the first electrical contact, the second electrical contact, and the third electrical contact are disposed in the interlayer dielectric.

* * * * *